(12) United States Patent
Jang

(10) Patent No.: US 11,600,601 B2
(45) Date of Patent: Mar. 7, 2023

(54) SEMICONDUCTOR PACKAGE

(71) Applicant: Samsung Electronics Co., Ltd., Suwon-si (KR)

(72) Inventor: Aenee Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 47 days.

(21) Appl. No.: 17/382,169

(22) Filed: Jul. 21, 2021

(65) Prior Publication Data

US 2022/0130799 A1 Apr. 28, 2022

(30) Foreign Application Priority Data

Oct. 27, 2020 (KR) ........................ 10-2020-0140115

(51) Int. Cl.
*H01L 23/00* (2006.01)
*H01L 25/065* (2023.01)
*H01L 23/48* (2006.01)

(52) U.S. Cl.
CPC ........ *H01L 25/0657* (2013.01); *H01L 23/481* (2013.01); *H01L 24/05* (2013.01);
(Continued)

(58) Field of Classification Search
CPC ... H01L 25/0657; H01L 23/481; H01L 24/05; H01L 24/06; H01L 24/08; H01L 24/16; H01L 24/32; H01L 24/73; H01L 25/0652; H01L 2224/05009; H01L 2224/06181; H01L 2224/08146; H01L 2224/16227; H01L 2224/32225; H01L 2224/73204; H01L 2225/06544; H01L 25/18; H01L 2224/16225; H01L 2225/06527; H01L 2924/15192; H01L 2924/15311;
(Continued)

(56) References Cited

U.S. PATENT DOCUMENTS 6,178,517 B1 1/2001 Bertin et al.
8,153,521 B2 4/2012 Kang et al.
(Continued)

FOREIGN PATENT DOCUMENTS

KR 10-2000-0011296 A 2/2000
KR 10-2010-0100302 A 9/2010
(Continued)

*Primary Examiner* — Elias Ullah
(74) *Attorney, Agent, or Firm* — Muir Patent Law, PLLC

(57) ABSTRACT

A semiconductor package comprising a first semiconductor chip and a second semiconductor chip disposed on the first semiconductor chip, wherein the first semiconductor chip includes a first semiconductor body, an upper pad structure, and a first through-electrode penetrating the first semiconductor body and electrically connected to the upper pad structure, and the second semiconductor chip includes a second semiconductor body, a lower bonding pad, and an internal circuit structure including a circuit element, internal circuit wirings, and a connection pad pattern disposed on the same level as the lower bonding pad, the upper pad structure includes upper bonding pads and connection wirings, the upper bonding pads are disposed at positions corresponding to the lower bonding pad and the connection pad pattern, and the internal circuit structure is electrically connected to the first through-electrode through at least one of the upper bonding pads and the connection wirings.

20 Claims, 11 Drawing Sheets

(52) U.S. Cl.
CPC .............. *H01L 24/06* (2013.01); *H01L 24/08* (2013.01); *H01L 24/16* (2013.01); *H01L 24/32* (2013.01); *H01L 24/73* (2013.01); *H01L 25/0652* (2013.01); *H01L 2224/05009* (2013.01); *H01L 2224/06181* (2013.01); *H01L 2224/08146* (2013.01); *H01L 2224/16227* (2013.01); *H01L 2224/32225* (2013.01); *H01L 2224/73204* (2013.01); *H01L 2225/06544* (2013.01)

(58) Field of Classification Search
CPC ................ H01L 23/528; H01L 23/485; H01L 23/49827; H01L 23/50; H01L 23/525; H01L 24/09
See application file for complete search history.

(56) References Cited

U.S. PATENT DOCUMENTS

| | | |
|---|---|---|
| 8,546,946 B2 | 10/2013 | Nin |
| 2001/0047450 A1 | 11/2001 | Gillingham et al. |
| 2012/0290760 A1 | 11/2012 | McCormack et al. |
| 2020/0066666 A1 | 2/2020 | Jin et al. |
| 2020/0135636 A1 | 4/2020 | Lee et al. |
| 2020/0152543 A1 | 5/2020 | Lin et al. |

FOREIGN PATENT DOCUMENTS

| | | |
|---|---|---|
| KR | 10-2011-0004111 A | 1/2011 |
| KR | 10-2014-0085874 A | 7/2014 |

SEMICONDUCTOR PACKAGE

CROSS-REFERENCE TO RELATED APPLICATION(S)

This application claims benefit of priority to Korean Patent Application No. 10-2020-0140115 filed on Oct. 27, 2020 in the Korean Intellectual Property Office, the disclosure of which is incorporated herein by reference in its entirety.

BACKGROUND

The present inventive concept relates to a semiconductor package, and more particularly, to a semiconductor package including a stacked chip structure.

There is a continuous demand for miniaturization and weight reduction of electronic components mounted on electronic products. In order to reduce the size and weight of electronic components, it is beneficial that semiconductor packages mounted thereon have a smaller volume and process high-capacity data. It is also beneficial that semiconductor chips mounted on such semiconductor packages are highly integrated and are combined in a single package in each semiconductor package.

SUMMARY

An aspect of the present inventive concept is to provide a semiconductor package with a smaller thickness.

According to an aspect of the present inventive concept, a semiconductor package includes: a first semiconductor chip; and a second semiconductor chip disposed on the first semiconductor chip, wherein each of the first and second semiconductor chips include a first region and a second region, wherein the first semiconductor chip includes: a first semiconductor body having a lower surface and an upper surface opposite each other; an upper insulating layer and an upper pad structure disposed on the upper surface of the first semiconductor body; a first through-electrode penetrating the first region of the first semiconductor body and electrically connected to the upper pad structure; and a first internal circuit structure disposed on the lower surface of the first semiconductor body and including a first circuit element and first internal circuit wirings in the second region, wherein the second semiconductor chip includes: a second semiconductor body having a lower surface and an upper surface opposite each other; a lower insulating layer and lower bonding pads disposed on the lower surface of the second semiconductor body; and a second internal circuit structure disposed on the lower surface of the second semiconductor body and including a second circuit element, second internal circuit wirings, and a connection pad pattern disposed on the same level as the lower bonding pads in the second region, wherein the upper pad structure includes upper bonding pads and connection wirings, the upper bonding pads are in contact with the lower bonding pads and the connection pad pattern, the upper bonding pads include a first upper bonding pad disposed in the first region and overlapping the first through-electrode and a second upper bonding pad disposed in the second region and disposed in contact with the connection pad pattern, and at least one of the connection wirings is electrically connected to the second upper bonding pad.

According to an aspect of the present inventive concept, a semiconductor package includes: a first semiconductor chip; and a second semiconductor chip disposed on the first semiconductor chip, wherein the first semiconductor chip includes: a first semiconductor body having a lower surface and an upper surface opposite each other; an upper pad structure disposed on the upper surface of the first semiconductor body; and a first through-electrode penetrating the first semiconductor body and electrically connected to the upper pad structure, the second semiconductor chip includes: a second semiconductor body having a lower surface and an upper surface opposite each other; a lower bonding pad disposed on the lower surface of the second semiconductor body; and an internal circuit structure disposed on the lower surface of the second semiconductor body and including a circuit element, internal circuit wirings, and a connection pad pattern disposed on the same level as the lower bonding pad, the upper pad structure includes upper bonding pads and connection wirings, the upper bonding pads are disposed at positions corresponding to the lower bonding pad and the connection pad pattern, and the internal circuit structure is electrically connected to the first through-electrode through at least one of the upper bonding pads and the connection wirings.

According to an aspect of the present inventive concept, a semiconductor package includes: a substrate; a stacked chip structure disposed on the substrate and including a plurality of semiconductor chips; chip bumps disposed between a lowermost semiconductor chip, among the plurality of semiconductor chips, and the substrate; an underfill material layer on the substrate; and a molded layer on the underfill material layer, wherein the plurality of semiconductor chips include a first semiconductor chip and a second semiconductor chip disposed on the first semiconductor chip, wherein each of the first and second semiconductor chips include a first region and a second region, wherein the first semiconductor chip includes: a first semiconductor body having a lower surface and an upper surface opposite each other; an upper insulating layer and an upper pad structure disposed on the upper surface of the first semiconductor body; a first through-electrode penetrating the first region of the first semiconductor body and electrically connected to the upper pad structure; and a first internal circuit structure disposed on the lower surface of the first semiconductor body and including a first circuit element and first internal circuit wirings in the second region, wherein the second semiconductor chip includes: a second semiconductor body having a lower surface and an upper surface opposite each other; a lower insulating layer and lower bonding pads disposed on the lower surface of the second semiconductor body; and a second internal circuit structure disposed on the lower surface of the second semiconductor body and including a second circuit element, second internal circuit wirings, and a connection pad pattern disposed on the same level as the lower bonding pads in the second region, wherein the upper pad structure includes upper bonding pads in contact with the lower bonding pads and the connection pad pattern and connection wirings electrically connected to the first through-electrode, wherein the second internal circuit structure is electrically connected to the first through-electrode through the connection wirings.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
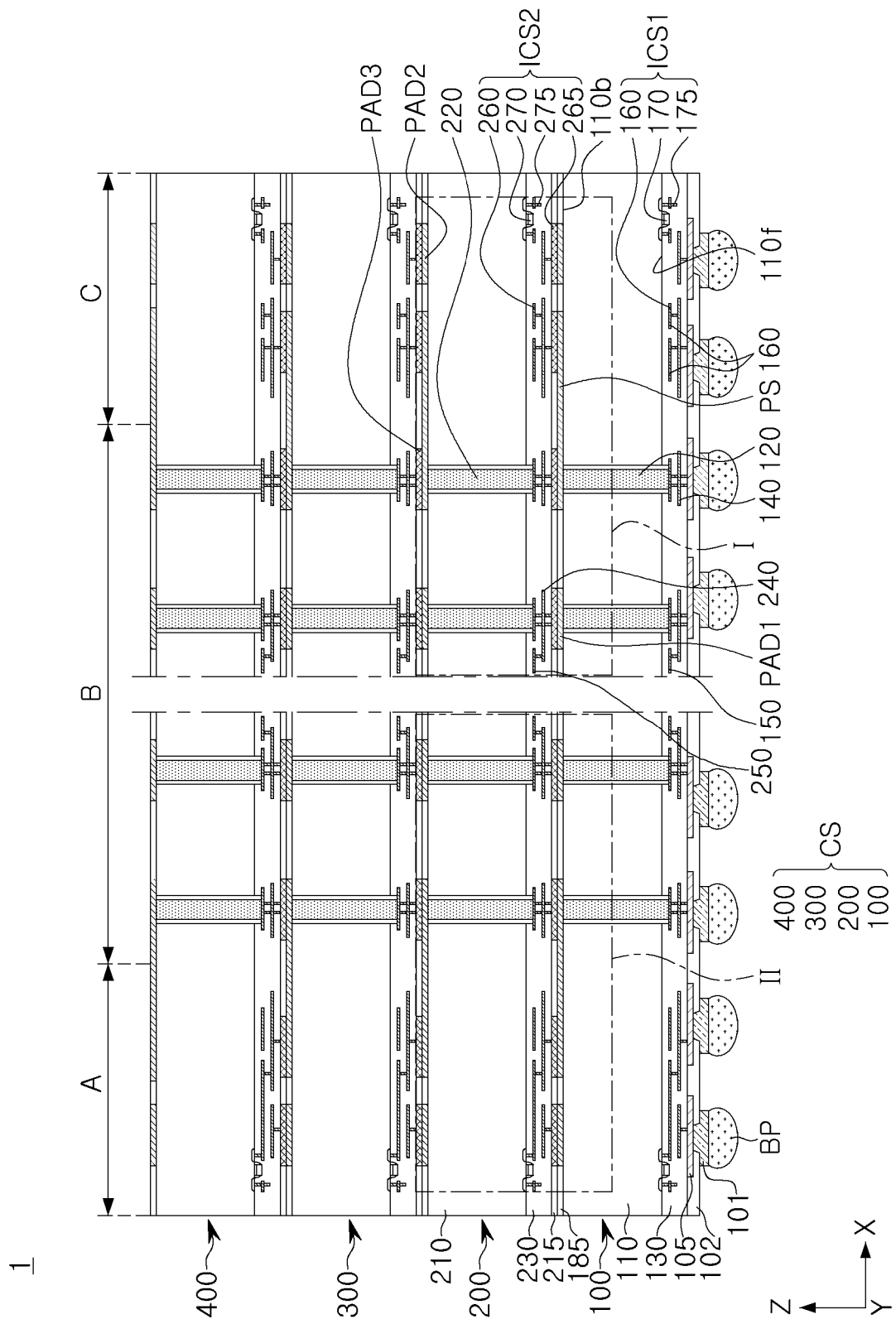
FIG. 1 is a schematic cross-sectional view of a semiconductor package according to example embodiments.
Figure 2:
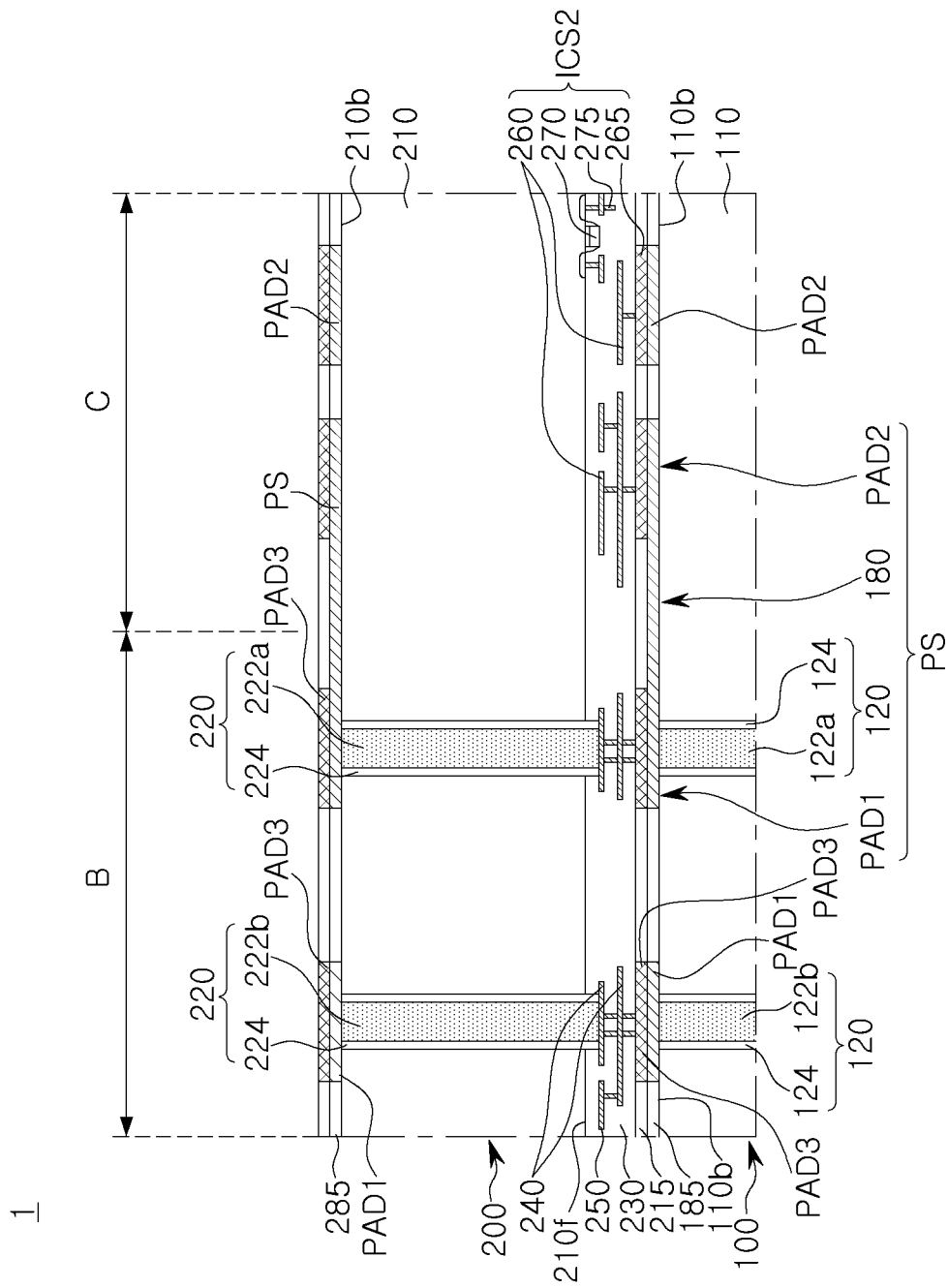
FIG. 2 is a partially enlarged view of a semiconductor package according to example embodiments.
Figure 3:
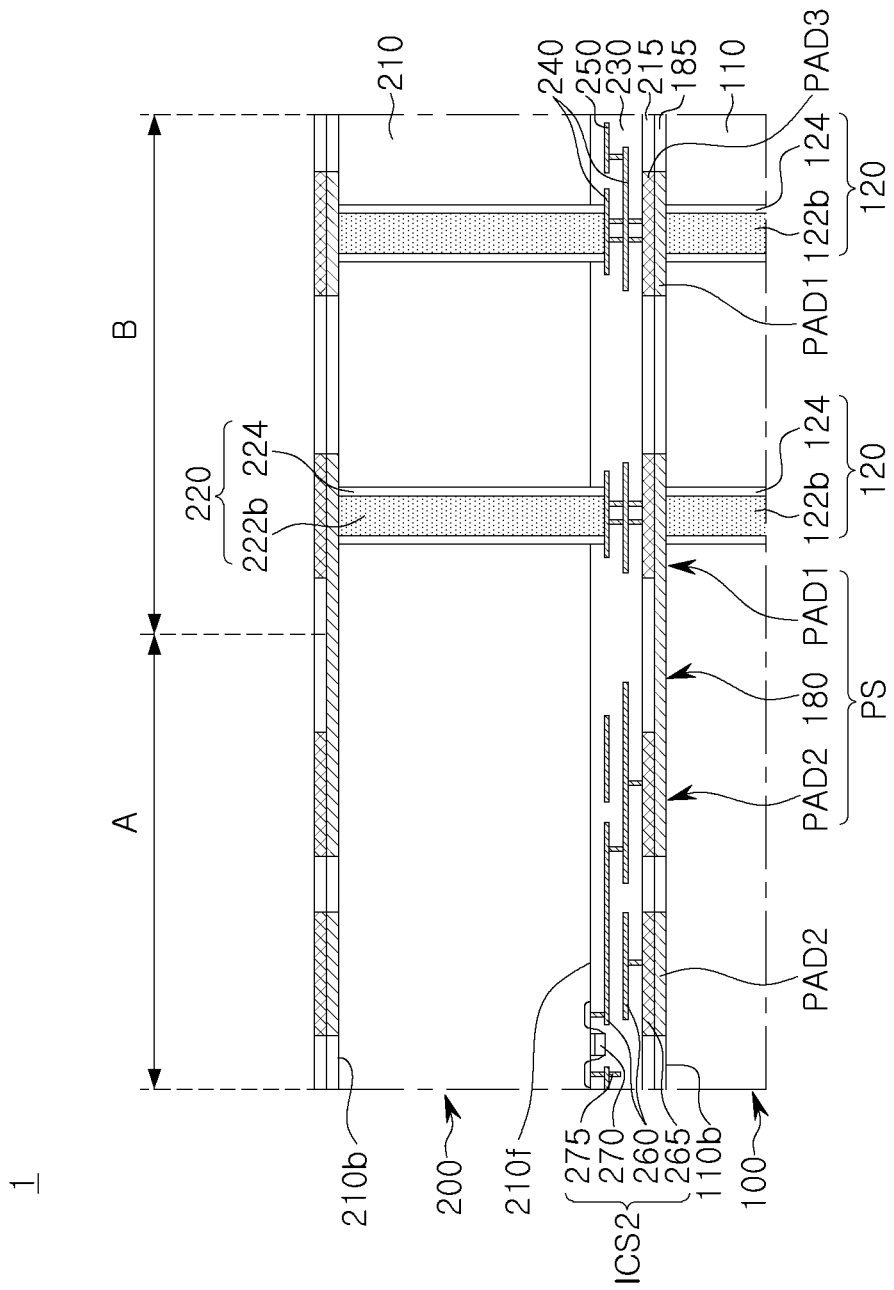
FIG. 3 is a partially enlarged view of a semiconductor package according to example embodiments.
Figure 4:
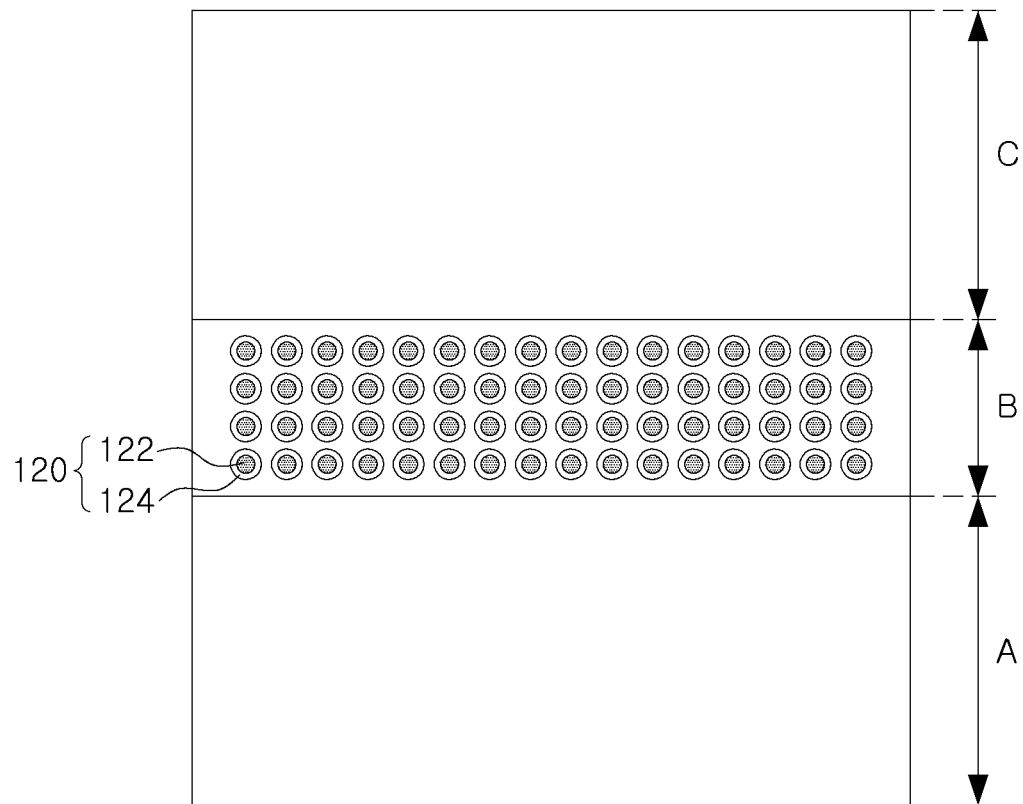
FIG. 4 is a plan view of a semiconductor package according to example embodiments.
Figure 5A:
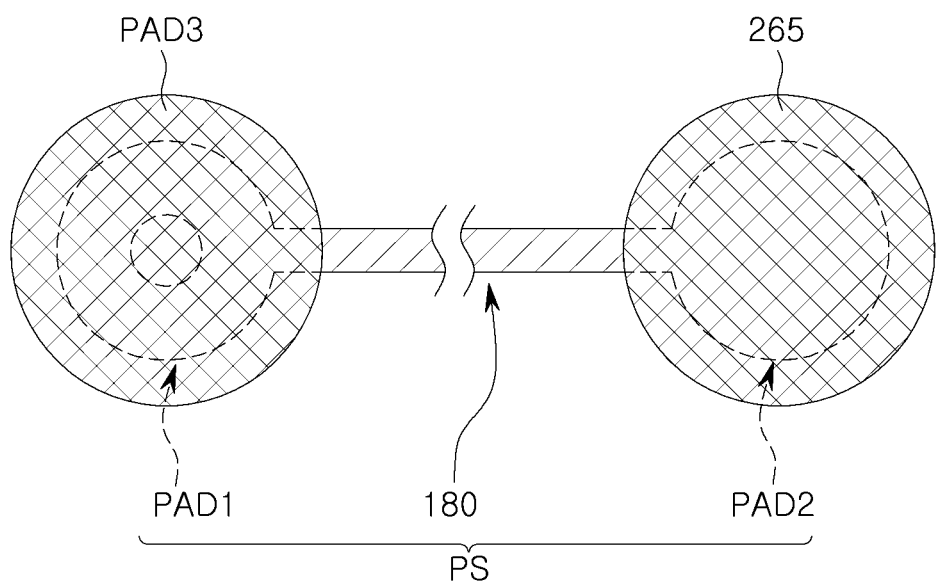
FIG. 5A is a schematic plan view of an upper pad structure, a lower bonding pad, and a connection pad pattern of a semiconductor package according to example embodiments.

FIG. 1 is a schematic cross-sectional view of a semiconductor package according to example embodiments. FIG. 2 is a partially enlarged view of a semiconductor package according to example embodiments. FIG. 3 is a partially enlarged view of a semiconductor package according to example embodiments. FIG. 2 is an enlarged view of region "I" of FIG. 1. FIG. 3 illustrates a region corresponding to region "II" of FIG. 1. FIG. 4 is a plan view of a semiconductor package according to example embodiments. FIG. 5A is a schematic plan view of an upper pad structure, a lower bonding pad, and a connection pad pattern of a semiconductor package according to example embodiments.

Referring to FIGS. 1 through 5A, a semiconductor package 1 may include a stacked chip structure CS including a plurality of semiconductor chips 100, 200, 300, and 400 spaced apart from each other in the z direction.

The semiconductor package 1 may further include a passivation layer 102, an under bump metal 101, and a chip bump BP disposed under the stacked chip structure CS.

In an example embodiment, the plurality of semiconductor chips 100, 200, 300, and 400 may be memory semiconductor chips.

The number of the plurality of semiconductor chips 100, 200, 300, and 400 is not limited to the number shown in the drawings. For example, the plurality of semiconductor chips 100, 200, 300, and 400 may include a larger number of semiconductor chips than two semiconductor chips or four semiconductor chips as depicted in the drawings.

In an example, the plurality of semiconductor chips 100, 200, 300, and 400 may be the same semiconductor chips. For example, the plurality of semiconductor chips 100, 200, 300, and 400 may be memory semiconductor chips such as DRAMs or memory semiconductor chips such as NAND flash memories. The types of the plurality of semiconductor chips 100, 200, 300, and 400 are not limited to the aforementioned DRAMs or NAND flash memories. For example, the plurality of semiconductor chips 100, 200, 300, and 400 may be PRAMs, resistance change memories (ReRAM), or magnetoresistive memories (MRAM).

In another example, the plurality of semiconductor chips 100, 200, 300, and 400 may include different types of semiconductor chips. For example, one of the plurality of semiconductor chips 100, 200, 300, and 400 may be a logic semiconductor chip or a processor chip, and one or more of the remaining chips may be memory semiconductor chips. For example, the plurality of semiconductor chips 100, 200, 300, and 400 may include a lower chip that may be a logic semiconductor chip or a process chip and one or more of memory semiconductor chips disposed on the lower chip.

Each of the plurality of semiconductor chips 100, 200, 300, and 400 may include a first region B and second regions A and C. As illustrated in the plan view of FIG. 4, the first region B may be a region in which through-electrode structures 120 and 220 penetrating semiconductor bodies 110 and 210 of semiconductor chips are disposed. The second regions A and C may be regions in which the through-electrode structures 120 and 220 are not disposed. For example, memory cells may be formed in the second regions A and C. In an example embodiment, the first region B may be disposed at the center of the semiconductor chips and the second regions A and C may be disposed outside the first region. However, the arrangement is not limited thereto and may be variously modified. In some embodiments of the present inventive concept, internal circuit structures ICS1 and ICS2 may be formed in the second regions A and C in which the through-electrode structures 120 and 220 are not disposed, and the internal circuit structures ICS1 and ICS2 and the through-electrode structures 120 and 220 disposed in the first region B may be electrically connected to enhance voltage characteristics.

As used herein, components described as being "electrically connected" are configured such that an electrical signal can be transferred from one component to the other (although such electrical signal may be attenuated in strength as it is transferred and may be selectively transferred).

The plurality of semiconductor chips 100, 200, 300, and 400 may include a first semiconductor chip 100 and a second semiconductor chip 200 disposed on the first semiconductor chip 100. According to embodiments of the present inventive concept, the first semiconductor chip 100 may be considered to be a lower chip located below the second semiconductor chip 200, and the second semiconductor chip 200 may be considered to be an upper chip located above the first semiconductor chip 100.

Spatially relative terms, such as "beneath," "below," "lower," "above," "upper" and the like, may be used herein for ease of description to describe positional relationships, such as illustrated in the figures, e.g., FIGS. 1-3 and 6-9. It will be understood that the spatially relative terms encompass different orientations of the device in addition to the orientation depicted in the figures.

The first semiconductor chip 100 may include a first semiconductor body 110 having a front surface 110f and a rear surface 110b opposite each other, an upper insulating layer 185 disposed on the rear surface 110b of the semiconductor body 110, an upper pad structure PS disposed on the rear surface 110b of the semiconductor body 110, first through-electrode structures 120 penetrating the first semiconductor body 110, and a first internal circuit structure ICS1. For example, the front surface 110f of the first semiconductor body 110 may be a lower surface of the first semiconductor body 110 facing downwards, and the rear surface 110b of the first semiconductor body 110 may be an upper surface of the first semiconductor body 110 facing upwards. In addition, the first semiconductor chip 100 may further include an electrode connection wiring 140, a circuit wiring 150 electrically connected to the electrode connection wiring 140, and a first lower internal insulating layer 130 covering the electrode connection wiring 140 and the circuit wiring 150. For example, the electrode connection wiring 140 may be a portion of wiring vertically overlapping (e.g., overlapping from a plan view) the first through-electrode structure 120, and the circuit wiring 150 may be a wiring formed in the first region B of the first semiconductor chip 100 and in a region non-overlapping (e.g., from a plan view) the first through-electrode structure 120.

The second semiconductor chip 200 may include a second semiconductor body 210 having a front surface 210f and a rear surface 210b opposite each other, an upper insulating layer 285 disposed on the rear surface 210b of the second semiconductor body 210, upper pad structure PS disposed on the rear surface 210b of the second semiconductor body 210, second through-electrode structures 220 penetrating the second semiconductor body 210 and electrically connected to the upper pad structure PS, a lower insulating layer 215 disposed on the front surface 210f of the second semiconductor body 210, lower bonding pads PAD3 disposed on the front surface 210f of the second semiconductor body 210, and a second internal circuit structure ICS2. For example, the front surface 210f of the second semiconductor body 210 may be a lower surface of the second semiconductor body 210 facing downwards, and the rear surface 210b of the second semiconductor body 210 may be an upper surface of the second semiconductor body 210 facing upwards. In addition, the second semiconductor chip 200 may further include an electrode connection wiring 240, a circuit wiring 250 electrically connected to the electrode connection wiring 240, and a second lower internal insulating layer 230 covering the electrode connection wiring 240 and the circuit wiring 250. For example, the electrode connection wiring 240 may be a portion of wiring vertically overlapping the second through-electrode structure 220, and the circuit wiring 250 may be a wiring formed in the first region B of the second semiconductor chip 200 and in a region non-overlapping the second through-electrode structure 220.

The first and second semiconductor bodies 110 and 210 may be semiconductor substrates. For example, the first and second semiconductor bodies 110 and 210 may be silicon substrates.

The upper pad structure PS may include upper bonding pads PAD1 and PAD2 and connection wirings 180.

The upper bonding pads PAD1 and PAD2 may include a first upper bonding pad PAD1 disposed in the first region B and overlapping the first through-electrode structure 120 and a second upper bonding pad PAD2 disposed in the second region A and C and not overlapping the first through-electrode structure 120. Each of first upper bonding pads PAD1 of the first semiconductor chip 100 may be coupled to and in contact with a lower bonding pad PAD3 of the second semiconductor chip 200 disposed in a position corresponding to the first upper bonding pad PAD1 of the first semiconductor chip 100. The second upper bonding pads PAD2 may be in contact with and coupled to connection pad patterns 265. For example, at least one of connection pad patterns 265 may perform the same function as the lower bonding pads PAD3. For example, the connection pad patterns 265 may be used to bond the first and second semiconductor chips 100 and 200. The first upper bonding pad PAD1 may be electrically connected to the first through-electrode 122. Since the first and second semiconductor chips 100 and 200 are bonded by the upper and lower bonding pads PAD1, PAD2, and PAD3 and the connection pad patterns 265 disposed at corresponding positions, a gap between the first and second semiconductor chips 100 and 200 may be minimized.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The upper bonding pads PAD1 and PAD2 and the lower bonding pads PAD3 may be formed of a conductive material that may be coupled/bonded with each other, while contacting each other, e.g., copper or the like.

The connection wirings 180 may be disposed to be electrically connected to the second internal circuit structure ICS2 disposed in the second regions A and C. The connection wirings 180 may be electrically connected to the upper bonding pads PAD1 and PAD2 and the first through-electrode structures 120. At least one of the connection wirings 180 of the first semiconductor chip 100 extends in a direction opposite to the first region B in which the first through-electrode structures 120 are disposed from the first upper bonding pad PAD1, so as to be electrically connected to the second internal circuit structure ICS2 of the second semiconductor chip 200.

At least one of the connection wirings 180 is disposed between the first upper bonding pad PAD1 and the second upper bonding pad PAD2 and electrically connect the first upper bonding pad PAD1 and the second upper bonding pad PAD2. At least one of the connection wirings 180 may be electrically connected to the second upper bonding pad PAD2.

As shown in FIG. 5A, the connection wirings 180 may extend from the first upper bonding pad PAD1 to connect the first upper bonding pad PAD1 and the second upper bonding pad PAD2. In FIG. 5A, it is illustrated that the sizes of the lower bonding pad PAD3 and the connection pad pattern 265 are larger than those of the upper bonding pads PAD1 and PAD2 but are not limited thereto and may be substantially the same or smaller.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

In an example embodiment, the connection wiring 180 extending from the first upper bonding pad PAD1, among the connection wirings 180 of the first semiconductor chip 100, may be in contact with the connection pad pattern 265 of the second semiconductor chip 200. At least a portion of the connection wiring 180 extending from the first upper bonding pad PAD1 may be in contact with the lower insulating layer 215 of the second semiconductor chip 200.

In an example embodiment, the connection wirings 180 may be disposed on the same level as the upper bonding pads PAD1 and PAD2, but are not limited thereto.

The connection wirings 180 may include or be formed of a conductive material, e.g., copper (Cu), aluminum (Al), silver (Ag), tin (Sn), gold (Au), nickel (Ni), lead (Pb), titanium (Ti), or an alloy thereof. The connection wirings 180 may perform various functions depending on designs.

For example, the connection wirings 180 may include a ground pattern GND, a power pattern PWR, and a signal pattern S. A ground signal may be applied to the ground pattern GND, and a power signal may be applied to the power pattern PWR. The signal pattern S may transmit various signals other than a ground signal and a power signal. For example, the signal pattern S may transmit a data signal.

In the embodiments of the present inventive concept, since a gap between the first and second semiconductor chips 100 and 200 can be minimized, the upper pad structure PS electrically connected to the first through-electrode 122 of the first semiconductor chip 100 may extend to a region, in which the first through-electrodes 122 are not disposed, so as to be electrically connected to the second internal circuit structure ICS2 of the second semiconductor chip 200 in the second regions A and C and form a separate electrical connection path in the regions other than the first region B.

The upper insulating layer 185 of the first semiconductor chip 100 may be in contact with and coupled to the lower insulating layer 215 of the second semiconductor chip 200.

The upper insulating layer 185 of the first semiconductor chip 100 and the lower insulating layer 215 of the second semiconductor chip 200 may be formed of an insulating material that may be bonded while contacting each other. For example, the upper insulating layer 185 and the lower insulating layer 215 may be formed of silicon oxide. In certain embodiments, the upper insulating layer 185 and the lower insulating layer 215 may be formed of SiCN or the like, without being limited to the silicon oxide.

The through-electrode structures 120 and 220 may include a first through-electrode structure 120 and a second through-electrode structure 220. The through-electrode structures 120 and 220 may electrically connect the electrode connection wirings 140 and 240 and the pad structure PS respectively.

The through-electrode structures 120 and 220 may include through-electrodes 122a, 122b, 222a, and 222b and insulating spacers 124 and 224 surrounding side surfaces of the through-electrodes 122a, 122b, 222a, and 222b, respectively. The through-electrodes 122a, 122b, 222a, and 222b may be formed of a conductive material such as copper or the like. The insulating spacers 124 and 224 may be formed of an insulating material. The insulating spacers 124 and 224 may insulate each of the through-electrodes 122a, 122b, 222a, and 222b from the semiconductor bodies 110 and 210.

Since the through-electrode structures 120 and 220 of the present inventive concept include through-electrodes 122a, 122b, 222a, 222b, the description of the present inventive concept for the through-electrode structure may also be interpreted as a description for the through-electrodes.

The through-electrodes 122a, 122b, 222a, and 222b may include power through-electrodes 122a and 222a and signal through-electrodes 122b and 222b. As shown in FIG. 2, in a region adjacent to the second region C, the through-electrode 122a electrically connected to the second internal circuit structure ICS2 of the second semiconductor chip 200 through the upper pad structure PS of the first semiconductor chip 100 may be a power through-electrode. For example, the through-electrode 122a electrically connected to the second internal circuit structure ICS2 of the second semiconductor chip 200 through the connection wirings 180 of the upper pad structure PS may be a power through-electrode. For example, the power through-electrode may be a path through which a power signal is transferred. For example, a power signal may be applied to the power through-electrode. As shown in FIG. 3, in a region adjacent to the second region A, the through-electrode 122b electrically connected to the second internal circuit structure ICS2 of the second semiconductor chip 200 through the upper pad structure PS of the first semiconductor chip 100 may be a signal through-electrode. For example, the through-electrode 122b electrically connected to the second internal circuit structure ICS2 of the second semiconductor chip 200 through the connection wirings 180 of the upper pad structure PS of the first semiconductor chip 100 may be a signal through-electrode. For example, signal through-electrode may be a path through which a data signal or a control signal is transferred. For example, a data signal or a control signal may be applied to the signal through-electrode. In the stacked chip structure CS, a through-electrode of the lower chip electrically connected to the internal circuit structure of the upper chip through the upper pad structure PS of the lower chip may be a power through-electrode 122a or a signal through-electrode 122b.

The electrode connection wirings 140 and 240 may be disposed to overlap the through-electrode structures 120 and 220. The electrode connection wirings 140 and 240 may be electrically connected to the through-electrode structures 120 and 220. The electrode connection wirings 140 and 240 may include or be formed of a conductive material such as copper (Cu), aluminum (Al), silver (Ag), tin (Sn), gold (Au), nickel (Ni), lead (Pb), titanium (Ti), or an alloy thereof. The electrode connection wirings 140 and 240 may perform various functions depending on designs. For example, electrode connection wirings 140 and 240 may include a ground pattern GND, a power pattern (PWR), and a signal pattern S. The signal pattern S may transmit various signals other than a ground signal and a power signal. For example, the signal pattern S may transmit a data signal.

The internal circuit structures ICS1 and ICS2 may include internal circuit wirings 160 and 260, circuit elements 170 and 270, and connection pad patterns 265. The internal circuit wirings 160 and 260, the circuit elements 170 and 270, and the connection pad patterns 265 may be covered by the lower internal insulating layer 230.

In an example embodiment, the internal circuit structures ICS1 and ICS2 may further include information storage structures 175 and 275 that store information.

The internal circuit structures (e.g., ICS1 and ICS2) may be disposed on the front surfaces of the plurality of semiconductor chips 100, 200, 300 and 400 in the second regions A and C. For example, the internal circuit structures ICS1 and ICS2 may be respectively disposed on the front surfaces 110f and 210f of the first and second semiconductor bodies 110 and 210. The internal circuit structures ICS1 and ICS2 may be disposed in a region in which the internal circuit structures ICS1 and ICS2 do not overlap the through-electrode structures 120 and 220. The internal circuit structures ICS1 and ICS2 may be disposed in the lower internal insulating layers 130 and 230.

The second internal circuit structure ICS2 of the second semiconductor chip 200 may be electrically connected to the through-electrode structure 120 of the first semiconductor chip 100 through the connection wirings 180 of the first semiconductor chip 100. For example, the second internal circuit structure ICS2 of the second semiconductor chip 200 may be electrically connected to the first through-electrode 122 of the first semiconductor chip 100 through at least one of the upper bonding pads PAD1 and PAD2 and the connection wirings 180.

In the second regions A and C, the internal circuit wirings 160 and 260 may be arranged in a mesh form but are not limited thereto and may be variously modified and arranged.

The connection pad patterns 265 may be disposed at substantially the same level as the lower bonding pad PAD3. The connection pad pattern 265 of the second semiconductor chip 200 may be electrically connected to the internal circuit wirings 260 of the second semiconductor chip 200 and the upper pad structure PS of the first semiconductor chip 100. Also, the connection pad pattern 265 of the second semiconductor chip 200 may be in contact with and couple to the second upper bonding pad PAD2 of the first semiconductor chip 100, like the lower bonding pad PAD3, e.g., contacting the first upper bonding pad PAD1.

The circuit elements 170 and 270 may include active elements such as transistors and passive elements such as resistors and capacitors.

In an example embodiment, each of the information storage structures 175 and 275 may be a memory cell capacitor of a DRAM.

Chip pads 105 may be disposed under the stacked chip structure CS and may be electrically connected to the electrode connection wiring 140 and the first internal circuit structure ICS1. For example, some chip pads 105 may be electrically connected to the electrode connection wiring 140, and some other chip pads 105 may be electrically connected to the first internal circuit structure ICS1.

The passivation layer 102 may be disposed under the lowermost semiconductor chip 100. The passivation layer 102 may be disposed on the lower internal insulating layer 130 of the first semiconductor chip 100. The passivation layer 102 may have an opening exposing at least a portion of a chip pad 105. The passivation layer 102 may include or be formed of an insulating material. For example, the passivation layer 102 may be ABF (Ajinomoto Build-up Film) or an epoxy resin layer, but is not limited thereto and may include other types of insulating materials.

The under bump metal 101 may be disposed in an opening of the passivation layer 102 and may be electrically connected to a portion of the chip pad 105 exposed by the opening of the passivation layer 102. The under bump metal 101 may be formed by a metallization method using a metal, but is not limited thereto.

Chip bumps BP may be electrically connected to the chip pad 105, the electrode connection wiring 140, and the internal circuit structure ICS1 through the under bump metal 101. The chip bumps BP may physically and/or electrically connect the semiconductor package 1 to the outside. The chip bumps BP may include a low melting point metal, e.g., tin (Sn) or an alloy including tin (Sn) (e.g., Sn—Ag—Cu). The chip bumps BP may be a land, a ball, or a pin. The chip bumps BP may include or may be copper pillars or solders.

Figure 5B:
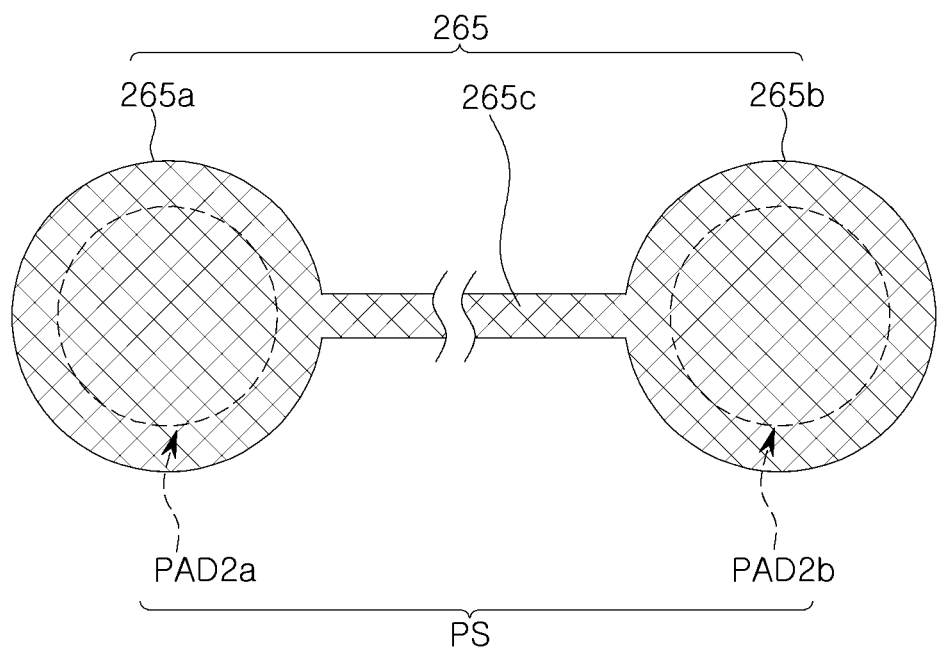
FIG. 5B is a schematic plan view illustrating a modification of an upper pad structure and a connection pad pattern of a semiconductor package according to example embodiments.

Next, various modifications of the upper pad structure PS of the first semiconductor chip 100 and the connection pad pattern 265 of the second semiconductor chip 200 according to example embodiments will be described with reference to FIGS. 5B and 5C. FIG. 5B is a schematic plan view showing a modification of the upper pad structure PS and the connection pad pattern 265 of the semiconductor package according to example embodiments, and FIG. 5C is a schematic plan view showing another modification of the pad structure PS and the connection pad pattern 265.

In a modification, referring to FIG. 5B, the upper pad structure PS of the first semiconductor chip 100 disposed below the connection pad pattern 265 may include a pair of second upper bonding pads PAD2a and PAD2b spaced apart from each other in the second regions A and C, and the connection pad pattern 265 of the second semiconductor chip 200 disposed above the upper pad structure PS may be bonded to the pair of second upper bonding pads PAD2a and PAD2b. The connection pad pattern 265 may include bonding portions 265a and 265b bonded to the second upper bonding pads PAD2a and PAD2b and a connection portion 265c extending from the bonding portions 265a and 265b to electrically connect the bonding portions 265a and 265b to each other.

In FIG. 5B, the bonding portions 265a and 265b of the connection pad pattern 265 are shown to be larger than the upper bonding pads PAD2a and PAD2b, but the present disclosure is not limited thereto and the bonding portions 265a and 265b may be substantially the same as or smaller to the upper bonding pads PAD2a and PAD2b in size.

Figure 5C:
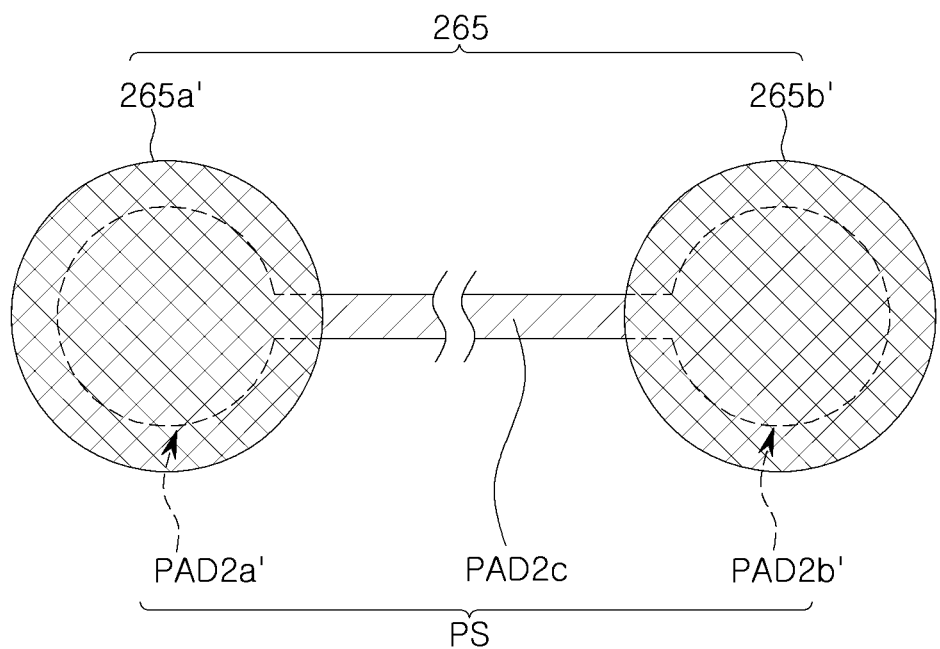
FIG. 5C is a schematic plan view illustrating a modification of an upper pad structure and a connection pad pattern of a semiconductor package according to example embodiments.

In a modification, referring to FIG. 5C, the upper pad structure PS of the first semiconductor chip 100 disposed lower than the connection pad pattern 265 may include a pair of second upper bonding pads PAD2a' and PAD2b' spaced apart from each other, and a pad connection portion PAD2c extending from the pair of second upper bonding pads PAD2a' and PAD2b' to electrically connect the pair of second bonding upper pads PAD2a' and PAD2b'. The connection pad pattern 265 of the second semiconductor chip 200 disposed above the upper pad structure PS may be bonded to the second upper bonding pads PAD2a' and PAD2b' and may include the connection pad patterns 265a' and 265b' spaced apart from each other.

In FIG. 5C, the connection pad patterns 265a' and 265b' are shown to be larger than the upper bonding pads PAD2a' and PAD2b', but the present disclosure is not limited thereto and the connection pad patterns 265a' and 265b' may be substantially the same as or smaller to the upper bonding pads PAD2a' and PAD2b' in size.

Figure 6:
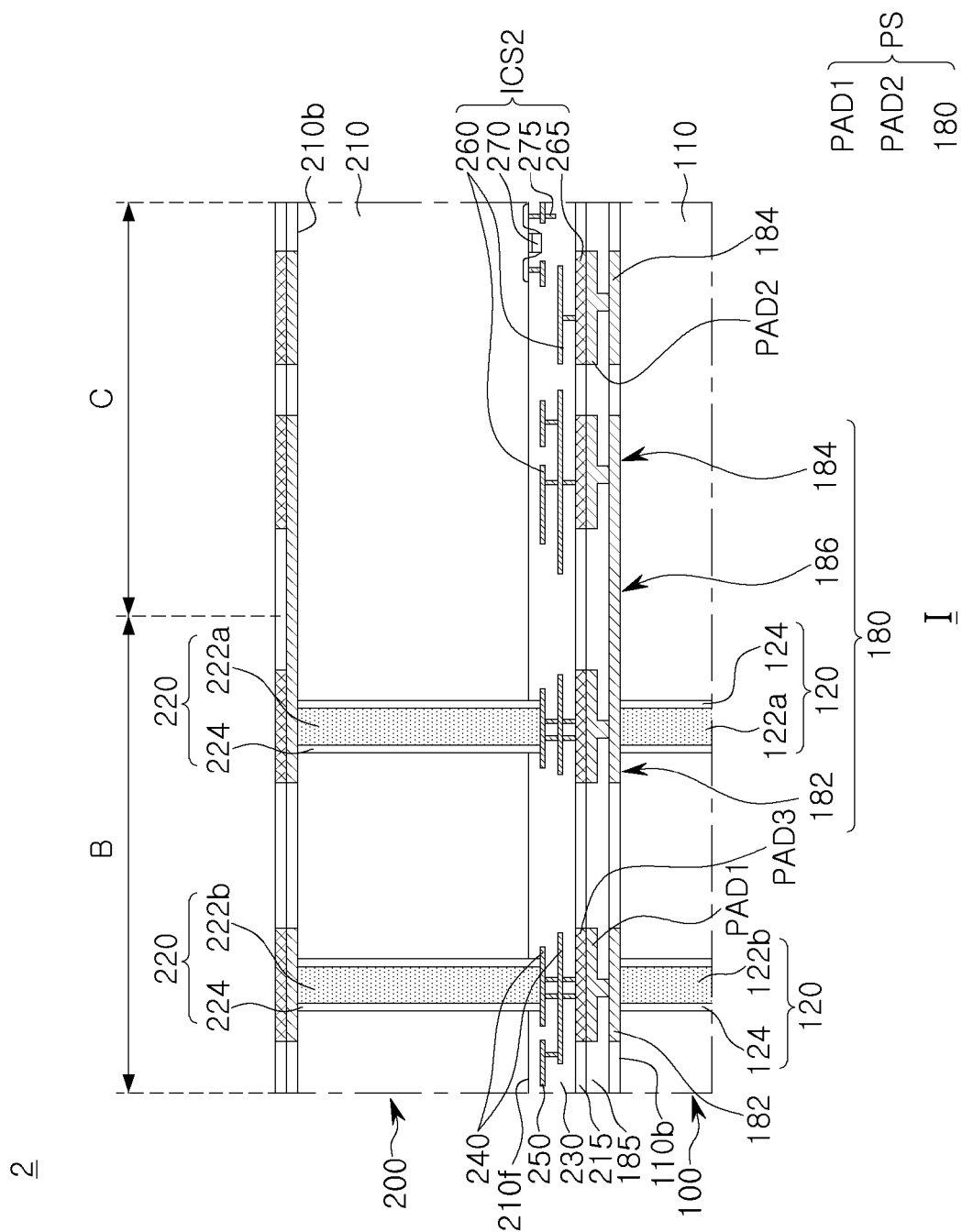
FIG. 6 is a schematic cross-sectional view of a semiconductor package according to example embodiments.

FIG. 6 is a partially enlarged view of a semiconductor package according to example embodiments. FIG. 6 shows a region corresponding to region "I" of FIG. 1. Referring to FIG. 6, only modified parts compared to the example embodiment of FIG. 5A will be described, and for the same components as the ones described above, the descriptions of FIGS. 1 through 5A may be equally applied.

Referring to FIG. 6, in a semiconductor package 2, the upper pad structure PS may consist of a plurality of layers. The connection wirings 180 may consist of a plurality of layers. In FIG. 6, two layers are shown, but the present inventive concept is not limited thereto.

The connection wirings 180 of the first semiconductor chip 100 may be disposed to be electrically connected to the second internal circuit structure ICS2 of the second semiconductor chip 200 disposed in the second regions A and C. The connection wirings 180 may be electrically connected to the first through-electrode structure 120.

The connection wirings 180 may further include a first upper pattern 182, a second upper pattern 184, and a connection portion 186 electrically connecting the first upper pattern 182 and the second upper pattern 184.

The first upper pattern 182 may be disposed to overlap the first upper bonding pad PAD1, and the second upper pattern 184 may be disposed to overlap the second upper bonding pad PAD2. The first upper pattern 182 may be disposed to overlap the lower bonding pad PAD3 disposed in the first region B, and the second upper pattern 184 may be disposed to overlap the connection pad pattern 265. The connection wirings 180 may be disposed at a level lower than the upper bonding pads PAD1 and PAD2. For example, the first and second upper patterns 182 and 184 may be disposed at a level lower than the upper bonding pads PAD1 and PAD2. A plurality of first upper patterns 182 and a plurality of second upper patterns 184 may be provided in each of the semiconductor chips 100, 200, 300 and 400. For example, the first and second upper patterns 182 and 184 may be provided in a plurality of layers. At least one of the first upper patterns 182 may be in contact with the first through-electrode structure 120.

At least one of the connection wirings 180 may include a connection portion 186 extending from the first upper pattern 182 and electrically connecting the first upper pattern 182 and the second upper pattern 184. When the connection wirings 180 electrically connect the first region and the second region at the level lower than the upper bonding pads PAD1 and PAD2, the connection wirings 180 may not be disposed between the upper bonding pads PAD1 and PAD2. An upper insulating layer 185 may be disposed between the first upper bonding pads PAD1 and the second upper bonding pads PAD2.

Figure 7:
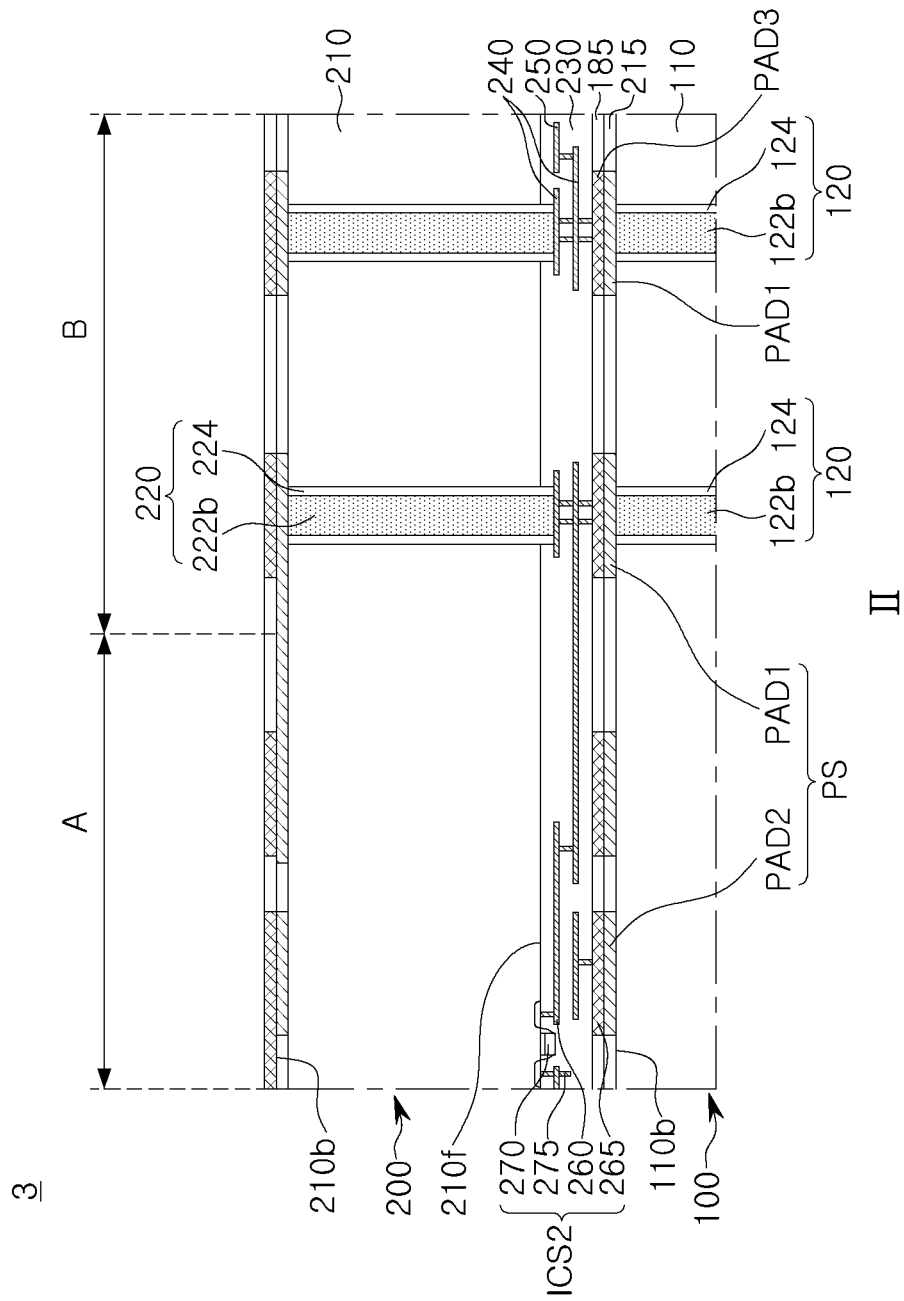
FIG. 7 is a schematic cross-sectional view of a semiconductor package according to example embodiments.

FIG. 7 is a schematic cross-sectional view of a semiconductor package according to example embodiments. FIG. 7 shows a region corresponding to region "II" of FIG. 1. Referring to FIG. 7, only a modified part compared to the example embodiment of FIG. 5A will be described, and for the same components as the ones described above, the descriptions of FIGS. 1 through 5A may be equally applied.

Referring to FIG. 7, in a semiconductor package 3, unlike the semiconductor package 1 of FIGS. 1 to 5A, the signal through-electrode 122*b* of the first semiconductor chip 100 may not be electrically connected to the second internal circuit structure ICS2 of the second semiconductor chip 200 by the upper pad structure PS.

The signal through-electrode 122*b* of the first semiconductor chip 100 may be in contact with the first upper bonding pad PAD1. The signal through-electrode 122*b* of the first semiconductor chip 100 may be electrically connected to the first upper bonding pad PAD1 and the lower bonding pad PAD3 of the second semiconductor chip 200. The signal through-electrode 122*b* of the first semiconductor chip 100 may be electrically connected to the second internal circuit structure ICS2 of the second semiconductor chip 200 through the electrode connection wiring 240 of the second semiconductor chip 200 electrically connected to the lower bonding pad PAD3.

For example, as shown in FIG. 5A, the power through-electrode 122*a* may be electrically connected to the second internal circuit structure ICS2 of the second semiconductor chip 200 by the connection wirings 180 of the upper pad structure PS in some embodiments. In certain embodiments, as shown in FIG. 7, since the first upper bonding pad PAD1 and the second upper bonding pad PAD2 are not connected by a connection wiring 180, the signal through-electrode 122*b* may not be electrically connected to the second internal circuit structure ICS2 of the second semiconductor chip 200 by the connection wirings 180. For example, the signal through-electrode 122*b* may be electrically connected to the second circuit structure ICS2 of the second semiconductor chip 200 by a wiring other than the connection wiring 180.

Figure 8:
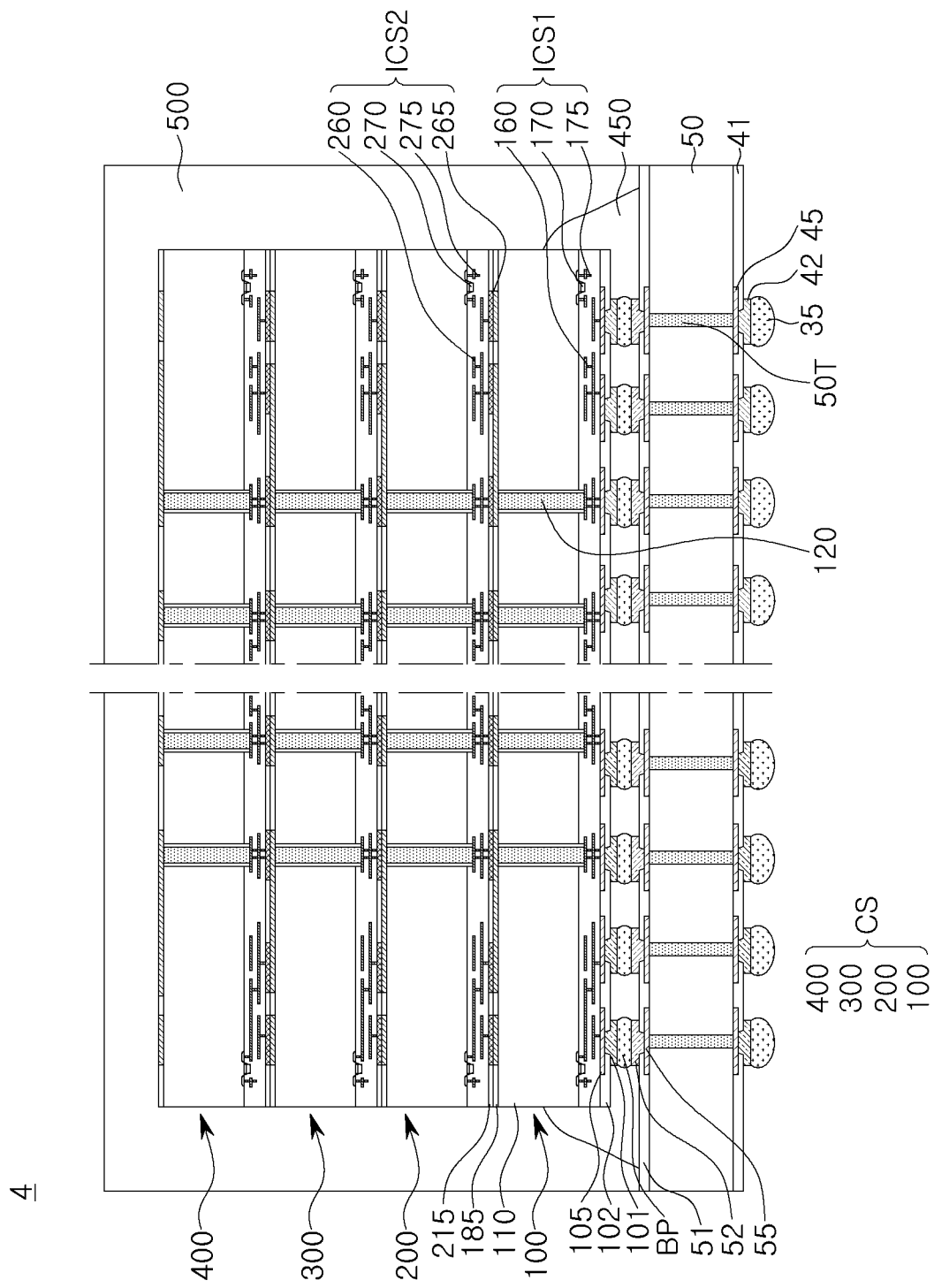
FIG. 8 is a schematic cross-sectional view of a semiconductor package according to example embodiments.

FIG. 8 is a schematic cross-sectional view of a semiconductor package according to example embodiments.

Referring to FIG. 8, a semiconductor package 4 may include a molded layer 500 covering the stacked chip structure CS and an underfill material layer 450 disposed on the substrate 50. The stacked chip structure CS of the semiconductor package 4 may be one of the stacked chip structures CS of the semiconductor packages 1, 2, and 3 described above with reference to FIGS. 1 through 7.

In an example embodiment, the semiconductor package 4 may include a substrate 50 disposed under chip bumps BP disposed under the stacked chip structure CS, first substrate pads 55 disposed on an upper surface of the substrate 50, second substrate pads 45 disposed on a lower surface of the substrate 50, and internal electrodes 50T electrically connecting the first substrate pads 55 and the second substrate pads 45. The internal electrodes 50T may be through-electrodes or internal wirings. The semiconductor package 4 may further include a first lower passivation layer 51 disposed on the upper surface of the substrate 50 and covering at least a portion of the first substrate pads 55 and a first bump metal 52 in contact with the chip bumps BP.

The molded layer 500 may be disposed on the underfill material layer 450. The molded layer 500 may be formed of an epoxy molding compound (EMC) including a filler.

The underfill material layer 450 may surround a side surface of each of the chip bumps BP and fill a portion between the stacked chip structure CS and the first lower passivation layer 51 on the substrate 50. The underfill material layer 450 may include an epoxy resin and a filler.

In an example embodiment, the semiconductor package 4 may further include a second lower passivation layer 41 disposed on a lower surface of the substrate 50 and covering at least a portion of the second substrate pads 45, a second bump metal 42, and substrate bumps 35.

In an example embodiment, the substrate 50 may be a printed circuit board (PCB), an interposer, or a semiconductor chip (e.g., a logic semiconductor chip).

The first and second substrate pads 55 and 45 and the internal electrodes 50T may be formed of a conductive material.

The first lower passivation layer 51 may have an opening exposing at least a portion of the first substrate pads 55. The first lower passivation layer 51 may include or be formed of an insulating material.

The second lower passivation layer 41 may have an opening exposing at least a portion of the second substrate pads 45. The second lower passivation layer 41 may include or be formed of an insulating material.

The first bump metal 52 may be disposed in the opening of the first lower passivation layer 51 and may be electrically connected to a portion of the first substrate pads 55 exposed by the opening of the first lower passivation layer 51.

The second bump metal 42 may be disposed in the opening of the second lower passivation layer 41 and may be electrically connected to a portion of the second substrate pads 45 exposed by the opening of the second lower passivation layer 41.

The first and second bump metals 52 and 42 may be formed by a metallization method using a metal, but are not limited thereto.

The substrate bumps 35 may be electrically connected to the second substrate pads 45 and the internal electrodes 50T through the second bump metal 42. The substrate bumps 35 may include or be formed of a low melting point metal, e.g., tin (Sn), an alloy including tin (Sn) (e.g., Sn—Ag—Cu), etc. The substrate bumps 35 may be lands, balls, or pins. The substrate bumps 35 may include or may be copper pillars or solders.

Figure 9:
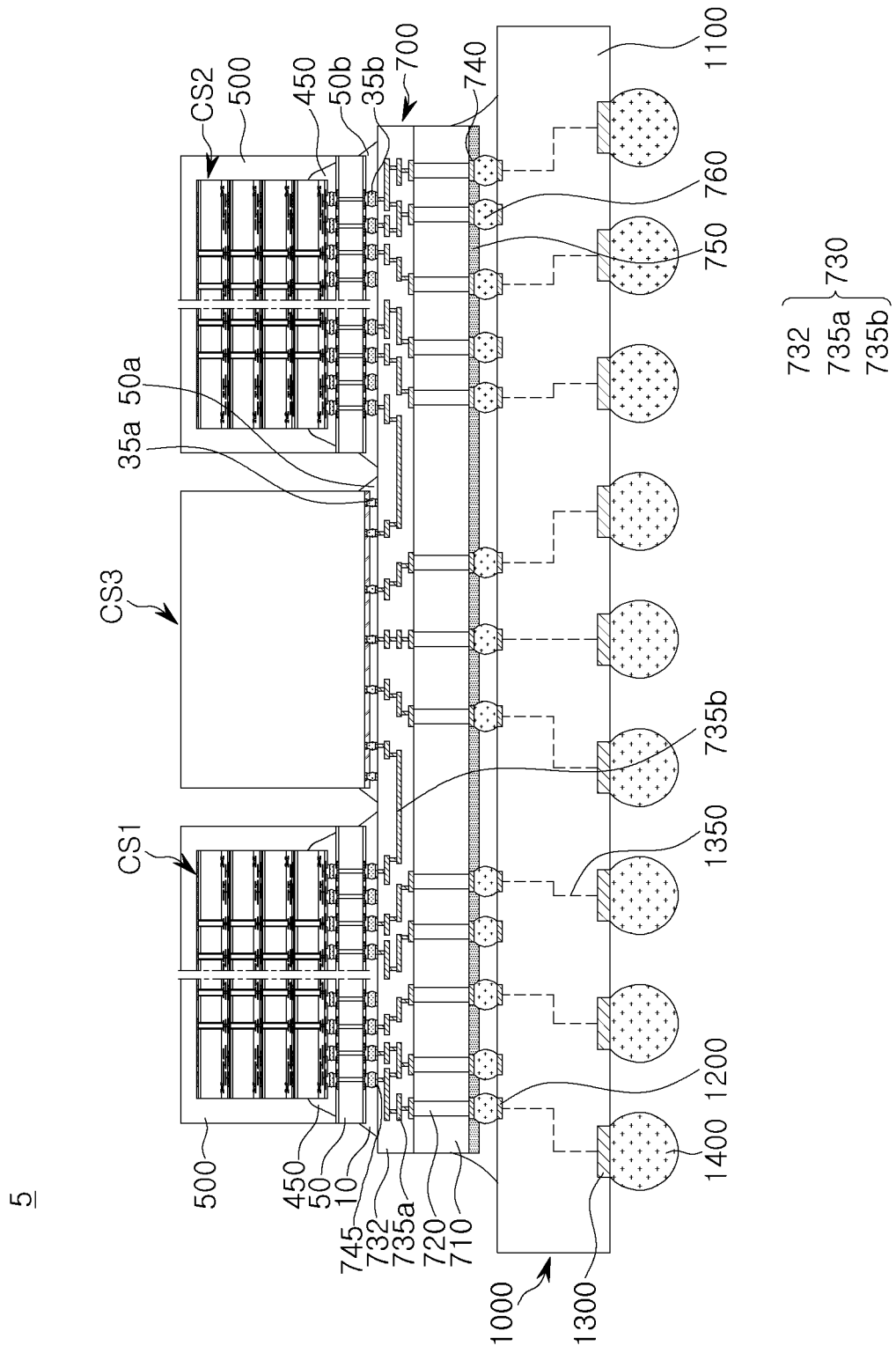
FIG. 9 is a schematic cross-sectional view of a semiconductor package according to example embodiments.

FIG. 9 is a schematic cross-sectional view of a semiconductor package according to example embodiments.

Referring to FIG. 9, a semiconductor package 5 may include a package substrate 1000, a connection substrate 700 on the package substrate 1000, a stacked semiconductor chip structure CS3 disposed on the connection substrate 700, and one or more stacked chip structures CS1 and CS2 spaced apart from the stacked semiconductor chip structure CS3 in a horizontal direction on the connection substrate 700.

The stacked chip structures CS1 and CS2 may be the same as or similar to the semiconductor package 4 described above with reference to FIG. 8. For example, the stacked chip structures CS1 and CS2 of the present embodiment may include the stacked chip structures CS of the semiconductor packages 1, 2, and 3 described above with reference to FIGS. 1 through 7.

The semiconductor package 5 may further include intermediate connection conductive bumps 760 electrically connecting the package substrate 1000 and the connection substrate 700 and disposed between the package substrate 1000 and the connection substrate 700, first connection conductive bumps 35a electrically connecting the connection substrate 700 and the stacked semiconductor chip structure CS3 and disposed between the connection substrate 700 and the stacked semiconductor chip structure CS3, and second connection conductive bumps 35b electrically connecting the connection substrate 700 and the stacked chip structures CS1 and CS2 and disposed between the connection substrate 700 and the stacked chip structures CS1 and CS2.

The semiconductor package 5 may further include a first underfill material layer 50a filling a portion between the connection substrate 700 and the stacked semiconductor chip structure CS3 and surrounding side surfaces of the first connection conductive bumps 35a and a second underfill material layer 50b filling a portion between the connection substrate 700 and the stacked chip structures CS1 and CS2 and surrounding side surfaces of the second connection conductive bumps 35b.

The package substrate 1000 may include a package body 1100, upper pads 1200 disposed at an upper portion of the package body 1100 and electrically connected to the connection conductive bumps 760, lower pads 1300 disposed at a lower portion of the package body 1100, a package internal wiring 1350 electrically connecting the upper pads 1200 and the lower pads 1300 and disposed inside the package body 1100, and lower solder balls 1400 in contact with the lower pads 1300 under the lower pads 1300.

The connection substrate 700 may be an interposer substrate or a redistribution substrate. The connection substrate 700 may include a semiconductor substrate 710, a through via 720, a wiring region/layer 730, and a third lower passivation layer 750.

The connection substrate 700 may include lower pads 740 disposed on a lower surface of the semiconductor substrate 710 and electrically connected to and in contact with the connection conductive bumps 760 and upper pads 745 disposed on an upper surface of the semiconductor substrate 710 and electrically connected to and in contact with the first and second connection conductive bumps 35a and 35b.

The semiconductor substrate 710 may be formed of a semiconductor material such as silicon.

The through vias 720 may be through silicon vias (TSVs) penetrating the semiconductor substrate 710 in a vertical direction. For example, each of the through vias 720 may include a conductive via pattern penetrating the semiconductor substrate 710 in a vertical direction and an insulating via spacer surrounding a side surface of the conductive via pattern.

The wiring region 730 may be disposed on the semiconductor substrate 710. The wiring region 730 may include an insulating layer 732 and wirings 735a and 735b embedded in the insulating layer 732.

In the connection substrate 700, the wirings 735a and 735b may include first wirings 735a and second wirings 735b.

The first wirings 735a may electrically connect some of the upper pads 745 and the through vias 720. The second wirings 735b may electrically connect stacked semiconductor chip structure CS3 and the stacked chip structures CS1 and CS2. The third lower passivation layer 750 may be disposed on a bottom surface of the semiconductor substrate 710.

In one example, at least one of the stacked chip structures CS1 and CS2 may include the plurality of semiconductor chips described above with reference to FIGS. 1 through 7 and may include a volatile memory device such as a dynamic RAM (DRAM), a non-volatile memory device such as a phase change RAM (PRAM), a magnetic RAM (MRAM), a resistive RAM (RRAM), a flash memory device, or a high-performance memory device such as a high bandwidth memory (HBM) or a hybrid memory cubic (HMC).

In one example, at least one of the plurality of semiconductor chips of the stacked semiconductor chip structure CS3 may be a logic chip such as a central processor (CPU), a graphic processor (GPU), a field programmable gate array (FPGA), a digital signal processor (DSP), a cryptographic processor, a microprocessor, a microcontroller, an analog-to-digital converter, or an application-specific IC (ASIC).

According to example embodiments of the present inventive concept, the semiconductor package including the pads in direct contact with each other and coupled to each other and insulating layers in direct contact with each other and coupled each other may be provided. The stacked chip structure described above may have improved reliability, while being reduced in size or volume.

According to example embodiments of the present inventive concept, since the connection wiring disposed on the rear surface of the lower semiconductor chip body is electrically connected to the internal circuit structure disposed on the front surface of the upper semiconductor chip body in a region in which the through-electrode structure is not disposed, thus improving power characteristics.

While example embodiments have been shown and described above, it will be apparent to those skilled in the art that modifications and variations could be made without departing from the scope of the present inventive concept as defined by the appended claims.

What is claimed is:
1. A semiconductor package comprising:
a first semiconductor chip; and
a second semiconductor chip disposed on the first semiconductor chip,
wherein each of the first and second semiconductor chips includes a first region and a second region,
wherein the first semiconductor chip includes:
  a first semiconductor body having a lower surface and an upper surface opposite each other;
  an upper insulating layer and an upper pad structure disposed on the upper surface of the first semiconductor body;
  a first through-electrode penetrating the first region of the first semiconductor body and electrically connected to the upper pad structure; and
  a first internal circuit structure disposed on the lower surface of the first semiconductor body and including a first circuit element and first internal circuit wirings in the second region, and
the second semiconductor chip includes:
  a second semiconductor body having a lower surface and an upper surface opposite each other;

a lower insulating layer and lower bonding pads disposed on the lower surface of the second semiconductor body; and a second internal circuit structure disposed on the lower surface of the second semiconductor body and including a second circuit element, second internal circuit wirings, and a connection pad pattern disposed at the same level as the lower bonding pads in the second region, wherein:
the upper pad structure includes upper bonding pads and connection wirings,
the upper bonding pads are in contact with the lower bonding pads and the connection pad pattern,
the upper bonding pads include a first upper bonding pad disposed in the first region and overlapping the first through-electrode and a second upper bonding pad disposed in the second region and disposed in contact with the connection pad pattern, and
at least one of the connection wirings is electrically connected to the second upper bonding pad.

2. The semiconductor package of claim 1, wherein:
at least one of the connection wirings extends from the first upper bonding pad to connect the first upper bonding pad to the second upper bonding pad.

3. The semiconductor package of claim 2, wherein:
the first upper bonding pad is electrically connected to the first through-electrode.

4. The semiconductor package of claim 2, wherein:
at least a portion of a connection wiring extending from the upper bonding pads, among the connection wirings, is in contact with the lower insulating layer.

5. The semiconductor package of claim 1, wherein:
the connection wirings consist of a plurality of layers.

6. The semiconductor package of claim 1, wherein:
the connection wirings further include a first upper pattern overlapping the first upper bonding pad and a second upper pattern overlapping the second upper bonding pad, and
the first and second upper patterns are disposed at a level lower than the upper bonding pads.

7. The semiconductor package of claim 6, wherein:
at least a portion of the connection wirings further include a connection portion extending from the first upper pattern to electrically connect the first upper pattern and the second upper pattern.

8. The semiconductor package of claim 6, wherein:
the first upper pattern is in contact with the first through-electrode.

9. The semiconductor package of claim 1, wherein:
the upper bonding pads include a plurality of second upper bonding pads,
a pair of the plurality of second upper bonding pads are disposed to be spaced apart from each other, and
the connection pad pattern includes bonding portions bonded to the pair of the second upper bonding pads and a connection portion electrically connecting the bonding portions.

10. The semiconductor package of claim 1, wherein the upper bonding pads include a plurality of second upper bonding pads,
a pair of the plurality of second upper bonding pads are disposed to be spaced apart from each other, and
wherein the semiconductor package further comprising:
a pad connection portion extending from the pair of the second upper bonding pads to electrically connect the pair of the second upper bonding pads.

11. The semiconductor package of claim 1, wherein the first through-electrode is a power through-electrode.

12. The semiconductor package of claim 11, wherein the first semiconductor chip further includes a second through-electrode penetrating the first region of the first semiconductor body and electrically connected to the upper pad structure,
wherein the second through-electrode is a signal through-electrode.

13. The semiconductor package of claim 1, wherein the second semiconductor chip further includes:
a second through-electrode penetrating the first region of the second semiconductor body and electrically connected to one of the lower bonding pads; and
an electrode connection wiring disposed on the lower surface of the second semiconductor body and disposed to overlap the second through-electrode.

14. The semiconductor package of claim 1, wherein the upper insulating layer and the lower insulating layer are in contact with each other.

15. The semiconductor package of claim 1, wherein the second internal circuit structure further includes a memory cell.

16. A semiconductor package comprising:
a first semiconductor chip; and
a second semiconductor chip disposed on the first semiconductor chip,
wherein the first semiconductor chip includes:
a first semiconductor body having a lower surface and an upper surface opposite each other;
an upper pad structure disposed on the upper surface of the first semiconductor body; and
a first through-electrode penetrating the first semiconductor body and electrically connected to the upper pad structure, and
the second semiconductor chip includes:
a second semiconductor body having a lower surface and an upper surface opposite each other;
a lower bonding pad disposed on the lower surface of the second semiconductor body; and
an internal circuit structure disposed on the lower surface of the second semiconductor body and including a circuit element, internal circuit wirings, and a connection pad pattern disposed on the same level as the lower bonding pad,
the upper pad structure includes upper bonding pads and connection wirings,
the upper bonding pads are disposed at positions corresponding to the lower bonding pad and the connection pad pattern, and
the internal circuit structure is electrically connected to the first through-electrode through at least one of the upper bonding pads and the connection wirings.

17. The semiconductor package of claim 16, wherein at least one of the connection wirings extends in a direction opposite to a region in which the first through-electrode is disposed from an upper bonding pad in contact with the lower bonding pad and electrically connected to the internal circuit structure.

18. The semiconductor package of claim 16, wherein the connection wirings include a first upper pattern overlapping the lower bonding pad, a second upper pattern overlapping the connection pad pattern, and a connection portion electrically connecting the first upper pattern and the second upper pattern.

19. A semiconductor package comprising:
a substrate;

a stacked chip structure disposed on the substrate and including a plurality of semiconductor chips;
chip bumps disposed between a lowermost semiconductor chip, among the plurality of semiconductor chips, and the substrate;
an underfill material layer on the substrate; and
a molded layer on the underfill material layer,
wherein the plurality of semiconductor chips include a first semiconductor chip and a second semiconductor chip disposed on the first semiconductor chip,
wherein each of the first and second semiconductor chips includes a first region and a second region,
wherein the first semiconductor chip includes:
 a first semiconductor body having a lower surface and an upper surface opposite each other;
 an upper insulating layer and an upper pad structure disposed on the upper surface of the first semiconductor body;
 a first through-electrode penetrating the first region of the first semiconductor body and electrically connected to the upper pad structure; and
 a first internal circuit structure disposed on the lower surface of the first semiconductor body and including a first circuit element and first internal circuit wirings in the second region,
wherein the second semiconductor chip includes:
 a second semiconductor body having a lower surface and an upper surface opposite each other;
 a lower insulating layer and lower bonding pads disposed on the lower surface of the second semiconductor body; and
 a second internal circuit structure disposed on the lower surface of the second semiconductor body and including a second circuit element, second internal circuit wirings, and a connection pad pattern disposed on the same level as the lower bonding pads in the second region,
wherein the upper pad structure includes upper bonding pads in contact with the lower bonding pads and the connection pad pattern, and connection wirings electrically connected to the first through-electrode, and
wherein the second internal circuit structure is electrically connected to the first through-electrode through the connection wirings.

20. The semiconductor package of claim 19, further comprising:
 a package substrate;
 a connection substrate on the package substrate;
 connection conductive bumps on the connection substrate; and
 a stacked semiconductor chip structure disposed on the connection substrate,
 wherein the stacked chip structure is disposed on the connection substrate and is spaced apart from the stacked semiconductor chip structure, and
 the connection conductive bumps are disposed between the connection substrate and the stacked chip structure and between the connection substrate and the stacked semiconductor chip structure.

* * * * *